(12) United States Patent
Liu

(10) Patent No.: US 11,289,554 B2
(45) Date of Patent: Mar. 29, 2022

(54) ORGANIC LIGHT EMITTING DEVICE AND FABRICATING METHOD THEREOF

(71) Applicant: Shenzhen China Star Optoelectronics Semiconductor Display Technology Co., Ltd., Guangdong (CN)

(72) Inventor: Hualong Liu, Guangdong (CN)

(73) Assignee: SHENZHEN CHINA STAR OPTOELECTRONICS SEMICONDUCTOR DISPLAY TECHNOLOGY CO., LTD., Guangdong (CN)

(*) Notice: Subject to any disclaimer, the term of this patent is extended or adjusted under 35 U.S.C. 154(b) by 13 days.

(21) Appl. No.: 16/497,972

(22) PCT Filed: May 14, 2019

(86) PCT No.: PCT/CN2019/086845
§ 371 (c)(1),
(2) Date: Sep. 26, 2019

(87) PCT Pub. No.: WO2020/206803
PCT Pub. Date: Oct. 15, 2020

(65) Prior Publication Data
US 2021/0066412 A1     Mar. 4, 2021

(30) Foreign Application Priority Data

Apr. 9, 2019     (CN) .......................... 201910278553.6

(51) Int. Cl.
*H01L 27/32*     (2006.01)
*H01L 51/00*     (2006.01)
*H01L 51/56*     (2006.01)

(52) U.S. Cl.
CPC ...... *H01L 27/3246* (2013.01); *H01L 27/3218* (2013.01); *H01L 51/0005* (2013.01); *H01L 51/0008* (2013.01); *H01L 51/56* (2013.01)

(58) Field of Classification Search
CPC ............. H01L 27/3211; H01L 27/3218; H01L 51/003–005; H01L 51/5262–5265
See application file for complete search history.

(56) References Cited

U.S. PATENT DOCUMENTS

2007/0075618 A1*  4/2007  Mitsuya .............. H01L 51/0004
                                                           313/292
2014/0117334 A1*  5/2014  Nakamura .......... H01L 51/5203
                                                           257/40

(Continued)

FOREIGN PATENT DOCUMENTS

GN           108565350 A         9/2018

*Primary Examiner* — Stephen M Bradley
(74) *Attorney, Agent, or Firm* — Mark M. Friedman

(57) ABSTRACT

The present invention provides an organic light emitting device and a fabricating method thereof. The organic light emitting device includes a thin film transistor substrate, a pixel defining layer, a reflective electrode layer, and a plurality of sub-pixels. The pixel defining layer is disposed on the thin film transistor substrate and includes a plurality of via holes; and the plurality of sub-pixels are disposed in the via holes correspondingly. A thin film stand layer is disposed on the thin film transistor substrate and corresponds to a portion of the via holes, causing a reduction in a depth of the portion of the via holes, and a depth of another portion of the via holes is greater than the depth of the portion of the via holes.

5 Claims, 4 Drawing Sheets

(56) References Cited

U.S. PATENT DOCUMENTS

2014/0197396 A1\* 7/2014 Madigan ............. H01L 27/3246
  257/40
2017/0279068 A1\* 9/2017 Shiratori ............. H01L 51/5253
2018/0254303 A1\* 9/2018 Mishima ............. H01L 51/5265

\* cited by examiner

ORGANIC LIGHT EMITTING DEVICE AND FABRICATING METHOD THEREOF

BACKGROUND OF INVENTION

Field of Invention

The present invention relates to a display field, and in particular to an organic light emitting device and a method of fabricating the same.

Description of Prior Art

Organic light emitting diodes (OLEDs) have been widely used in fields of display, lighting, and smart wear due to their great self-luminous characteristics, high contrast, and fast response times.

Methods for preparing organic light emitting devices are mainly divided into an evaporation method and a printing method. Nowadays, technology of preparing large, medium, and small size organic light-emitting devices by a full evaporation method is quite mature compared to printing technology, and has been used for commercial production. However, the full evaporation technology has a problem of a low material utilization rate and is difficult for preparing a high-resolution device. A material utilization rate of the printing technology for preparing a device reaches 90% or more, and the cost of preparing the device is about 17% lower than that of the full evaporation technology. In addition, the printing process can be performed without a mask, and can be used for preparation of a high-resolution display device. Therefore, preparation of the large-size, high-resolution organic light emitting devices is a research hotspot in the field of display.

As shown in FIG. 1 and FIG. 2, a method of fabricating a conventional organic light emitting device includes the following steps: preparing a thin film transistor (TFT) substrate 1; forming a pixel defining layer 2 thereon; forming a red sub-pixel (R) via hole 21, a green sub-pixel (G) via hole 22, and a blue sub-pixel (B) via hole 23 on the pixel defining layer 2; forming a reflective electrode layer 3 in the RGB via holes (21, 22, 23); and filling the RGB via holes (21, 22, 23) with an inkjet printing ink on the reflective electrode layer 3, followed by drying to form a red sub-pixel 201, a green sub-pixel 303, and a blue sub-pixel 203.

Due to the small pixel size, there are problems negatively affecting device performance or color mixing during printing. As shown in FIG. 1, if a first node having a microcavity effect is used, the red sub-pixel and the green sub-pixel can be realized. However, a blue light has a short wavelength, and a hole transport layer (HTL) and a hole injection layer (HIL) of the first node device structure have only a few dozen nanometers, and such thin layers may negatively affect device performance.

As shown in FIG. 2, if the RGB pixels all adopt a second node having the microcavity effect, each layer of RGB pixels in the device is thicker, easily resulting in a risk of overflow and color mixing during printing. If the ink density of the blue sub-pixel is increased alone, it will cause printing difficulties.

An object of the present invention is to provide an organic light emitting device and a fabricating method thereof, which can realize the film thickness in a pixel to satisfy device performance during inkjet printing, while prevent an overflow problem caused by excessive printing ink, thereby improving a production yield of the organic light emitting device.

SUMMARY OF INVENTION

In order to solve the above problems, an embodiment of the present invention provides an organic light emitting device, including a thin film transistor substrate, a pixel defining layer, a reflective electrode layer, and a plurality of sub-pixels. The pixel defining layer is disposed on the thin film transistor substrate and includes a plurality of via holes; and the plurality of sub-pixels are disposed in the via holes correspondingly; wherein a thin film stand layer is disposed on the thin film transistor substrate, and the thin film stand layer corresponding to a portion of the via holes causes a reduction in a depth of the portion of the via holes, and a depth of another portion of the via holes is greater than the depth of the portion of the via holes.

Further, the via holes comprise at least one red sub-pixel via hole, at least one green sub-pixel via hole, and at least one blue sub-pixel via hole; the sub-pixels comprise at least one red sub-pixel, at least one green sub-pixel, and at least one blue sub-pixel, which are respectively disposed in the red sub-pixel via hole, the green sub-pixel via hole, and the blue sub-pixel via hole; and the thin film stand layer is disposed on the thin film transistor substrate and corresponds to the red sub-pixel via hole and the green sub-pixel via hole, such that depths of the red sub-pixel via hole and the green sub-pixel via hole are less than a depth of the blue sub-pixel via hole.

Further, the thin film stand layer has a thickness ranging from 0.1 um to 3 um.

Further, a material of the thin film stand layer comprises $SiO_2$.

Further, the red sub-pixel, the green sub-pixel, and the blue sub-pixel are prepared by an inkjet printing.

Further, the thin film stand layer is prepared by evaporation, sputtering, or coating.

Further, the pixel defining layer has a thickness ranging from 1 um to 5 um.

Further, the organic light emitting device further includes a reflective electrode layer disposed between the thin film transistor substrate and the pixel defining layer, and disposed in the red sub-pixel via hole, the green sub-pixel via hole, and the blue sub-pixel via hole.

Another embodiment of the present invention provides a method of fabricating an organic light emitting device, including the following steps:

providing the thin film transistor substrate;

a thin film stand layer forming step, forming the thin film stand layer on the thin film transistor substrate by evaporation, sputtering, or coating, a material of the thin film stand layer comprising SiO2, and a thickness of the thin film stand layer ranging from 0.1 um to 3 um, wherein a thin film stand is patterned to form the thin film stand layer having a same area as red and green light emitting areas;

a pixel defining layer forming step, fabricating the pixel defining layer on the thin film transistor substrate, wherein the pixel defining layer has a thickness ranging from 1 um to 5 um; and patterning the pixel defining layer to form a red sub-pixel via hole, a green sub-pixel via hole, and a blue sub-pixel via holes;

an inkjet printing step, filling the red sub-pixel via hole, the green sub-pixel via hole, and the blue sub-pixel via hole with an inkjet printing ink, followed by drying to form a red sub-pixel, a green sub-pixel, and a blue sub-pixel.

Further, the method of fabricating the organic light emitting device further includes a reflective electrode layer forming step after the pixel defining layer forming step and before the inkjet printing step, wherein in the reflective electrode layer forming step, a reflective electrode layer is formed in the red sub-pixel via hole, the green sub-pixel via hole, and the blue sub-pixel via hole.

The invention has beneficial effects of providing an organic light emitting device and a method of fabricating the organic light emitting device thereof, wherein the thin film stand layer is disposed to raise the red sub-pixel via hole and the green sub-pixel via hole, such that the thickness of the layers satisfies the performance of the device during inkjet printing while prevents overflow problem caused by excessive printing ink, thereby improving a production yield of an organic light emitting device.

Figure 1:
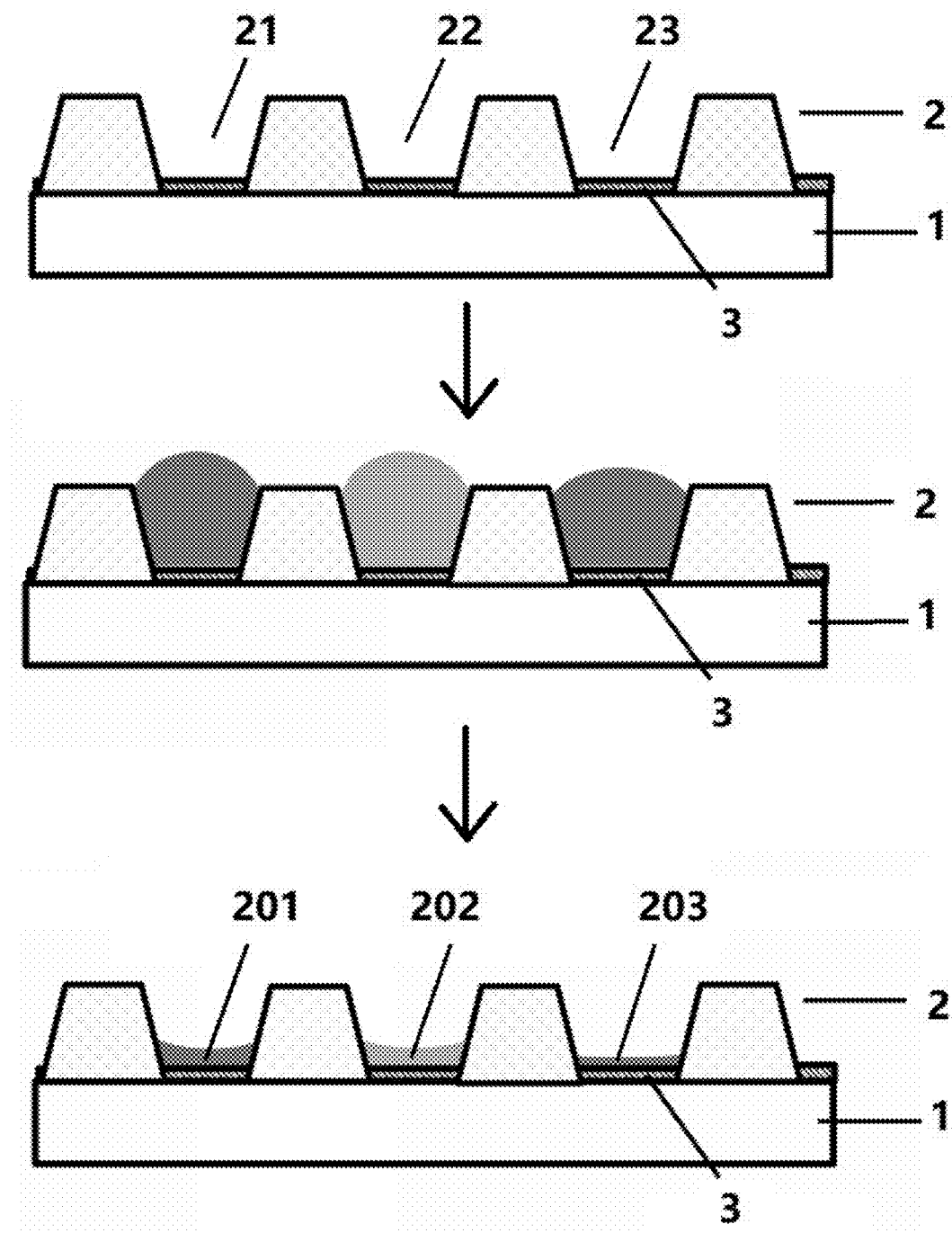
FIG. 1 is a schematic structural diagram of a conventional process for fabricating an organic light emitting device using a first microcavity node.
Figure 2:
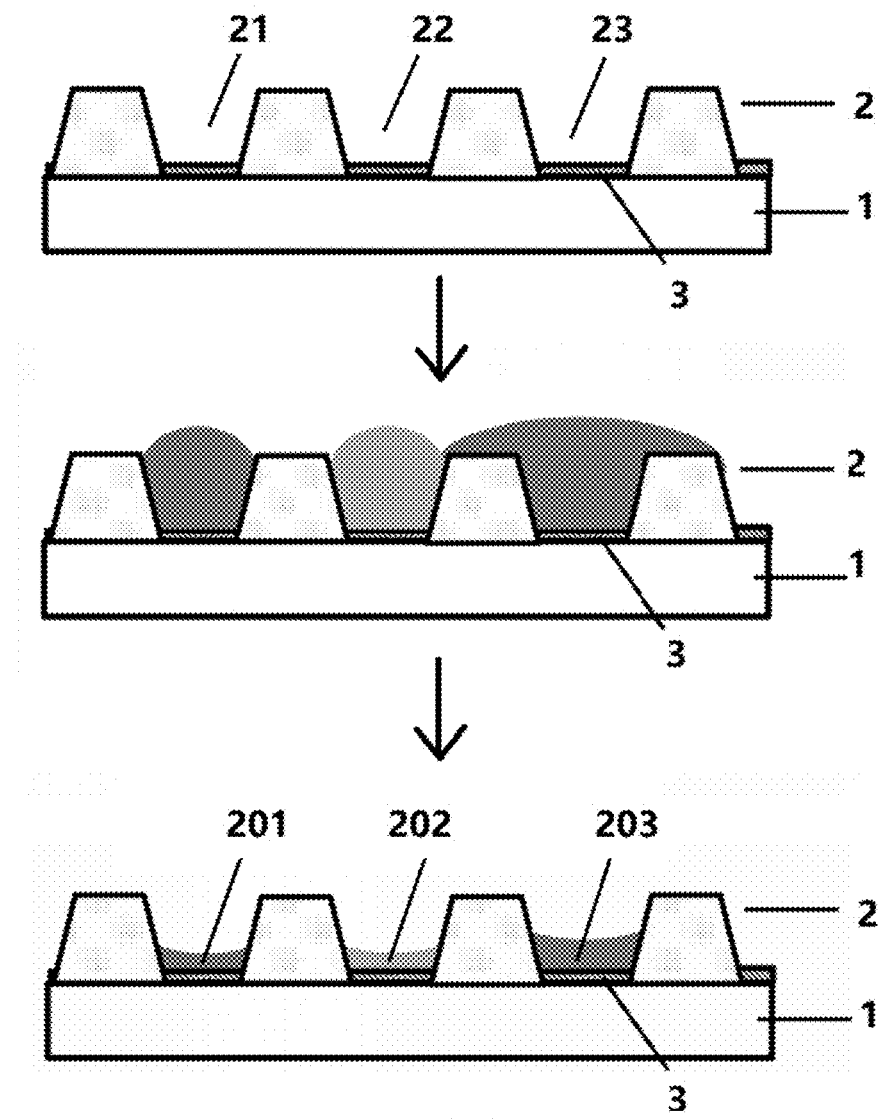
FIG. 2 is a schematic structural diagram of a conventional process for fabricating an organic light emitting device using a second microcavity node.
Figure 3:
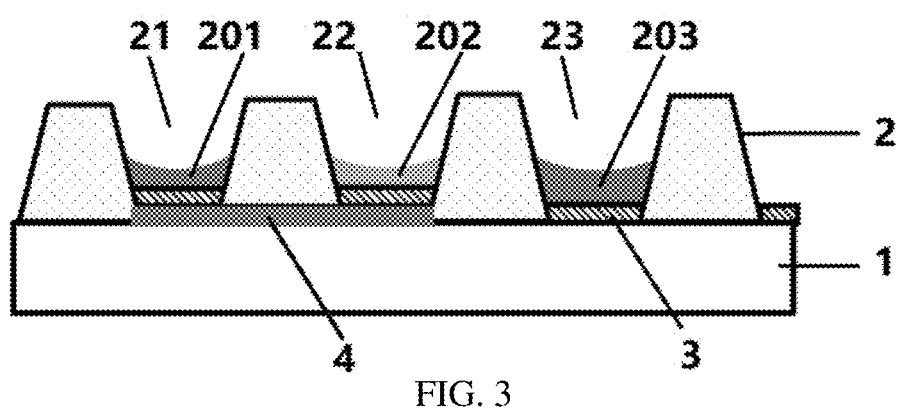
FIG. 3 is a schematic structural diagram of an organic light emitting device according to an embodiment of the present invention.

Elements in the drawings are designated by reference numerals listed below:
1, thin film transistor substrate
2, pixel defining layer
3, reflective electrode layer
4, thin film stand layer
21, red sub-pixel via hole
22, green sub-pixel via hole
23, blue sub-pixel via hole
201, a red sub-pixel
202, a green sub-pixel
203, a blue sub-pixel

DETAILED DESCRIPTION OF PREFERRED EMBODIMENTS

In the description of the present invention, it is to be understood that the terms "center", "longitudinal", "transverse", "length", "width", "thickness", "upper", "lower", "front", "Orientations of "post", "left", "right", "vertical", "horizontal", "top", "bottom", "inside", "outside", "clockwise", "counterclockwise", and the like are based on the orientation or positional relationship shown in the drawings, and is merely for the convenience of describing the present invention and simplifying the description, and is not intended to indicate or imply that the device or component must to be in particular orientations, or constructed and operated in a particular orientation, and thus are not to be construed as limiting the present invention. Moreover, the terms "first" and "second" are used for descriptive purposes only and are not to be construed as indicating or implying a relative importance or implicitly indicating the number of technical features indicated. Thus, features defining "first" or "second" may include one or more of the described features either explicitly or implicitly. In the description of the present invention, the meaning of "a plurality" is two or more unless specifically and specifically defined otherwise.

An organic light emitting device includes a thin film transistor substrate 1, a pixel defining layer 2, a reflective electrode layer 3, and a plurality of sub-pixels 21, 22, 23. The pixel defining layer 2 is disposed on the thin film transistor substrate 1 and includes a plurality of via holes, such as at least one red sub-pixel via hole 21, at least one green sub-pixel via hole 22, and at least one blue sub-pixel via hole 23. The reflective electrode layer 3 is disposed in the red sub-pixel via hole 21, the green sub-pixel via hole 22, and the blue sub-pixel via hole 23. The sub-pixel includes at least one red sub-pixel 201, at least one green sub-pixel 202, and at least one blue sub-pixel 203, which are respectively disposed in the red sub-pixel via hole 21, the green sub-pixel via hole 22, and the blue sub-pixel via hole 23 correspondingly.

A thin film stand layer 4 is disposed on the thin film transistor substrate 1, wherein the thin film stand layer 4 corresponding to a portion of the via holes causes a reduction in a depth of the portion of the via holes, and a depth of another portion of the via holes is greater than the depth of the portion of the via holes. In this embodiment, the thin film stand layer 4 corresponds to the red sub-pixel via hole 21 and the green sub-pixel via hole 22, and is exposed by the red sub-pixel via hole 21 and the green sub-pixel via hole 22. The thin film stand layer 4 is configured to reduce the depth of the red sub-pixel via hole 21 and the green sub-pixel via hole 22, and depths of the red sub-pixel via hole 21 and the green sub-pixel via hole 22 may be less than depth of the blue sub-pixel via hole 23. It can also be said that the height of a dam between the red sub-pixel via hole 21 and the green sub-pixel via hole 22 is smaller than the height of dams at both sides of the blue sub-pixel via hole 23.

It can be seen that bottoms of the red sub-pixel via hole 21 and the green sub-pixel via hole 22 are the thin film stand layer 4, while the bottom of the blue sub-pixel via hole 23 is the thin film transistor substrate. The depth of the blue sub-pixel via hole 23 is equal to a thickness of the pixel defining layer 2.

The thickness of the thin film stand layer 4 ranges from 0.1 um to 3 um.

A material of the thin film stand layer 4 comprises SiO2.

The red sub-pixel 21, the green sub-pixel 22, and the blue sub-pixel 23 are prepared by an inkjet printing.

The thin film stand layer 4 is prepared by evaporation, sputtering or coating.

The pixel defining layer 2 has a thickness ranging from 1 um to 5 um.

A reflective electrode layer 3 is further disposed between the thin film transistor substrate 1 and the pixel defining layer 2, and disposed in the red sub-pixel via hole 21, the green sub-pixel via hole 22, and the blue sub-pixel via hole 23.

Figure 4:
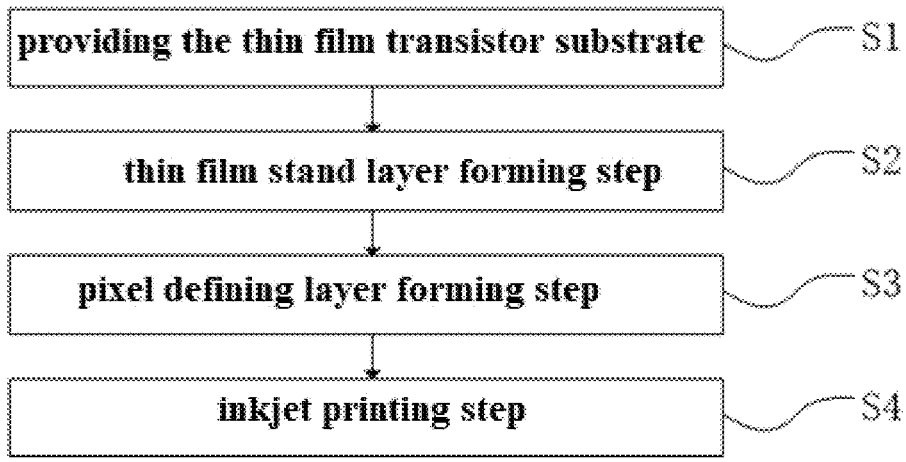
FIG. 4 is a flow chart of fabricating an organic light emitting device according to an embodiment of the present invention.
Figure 6:
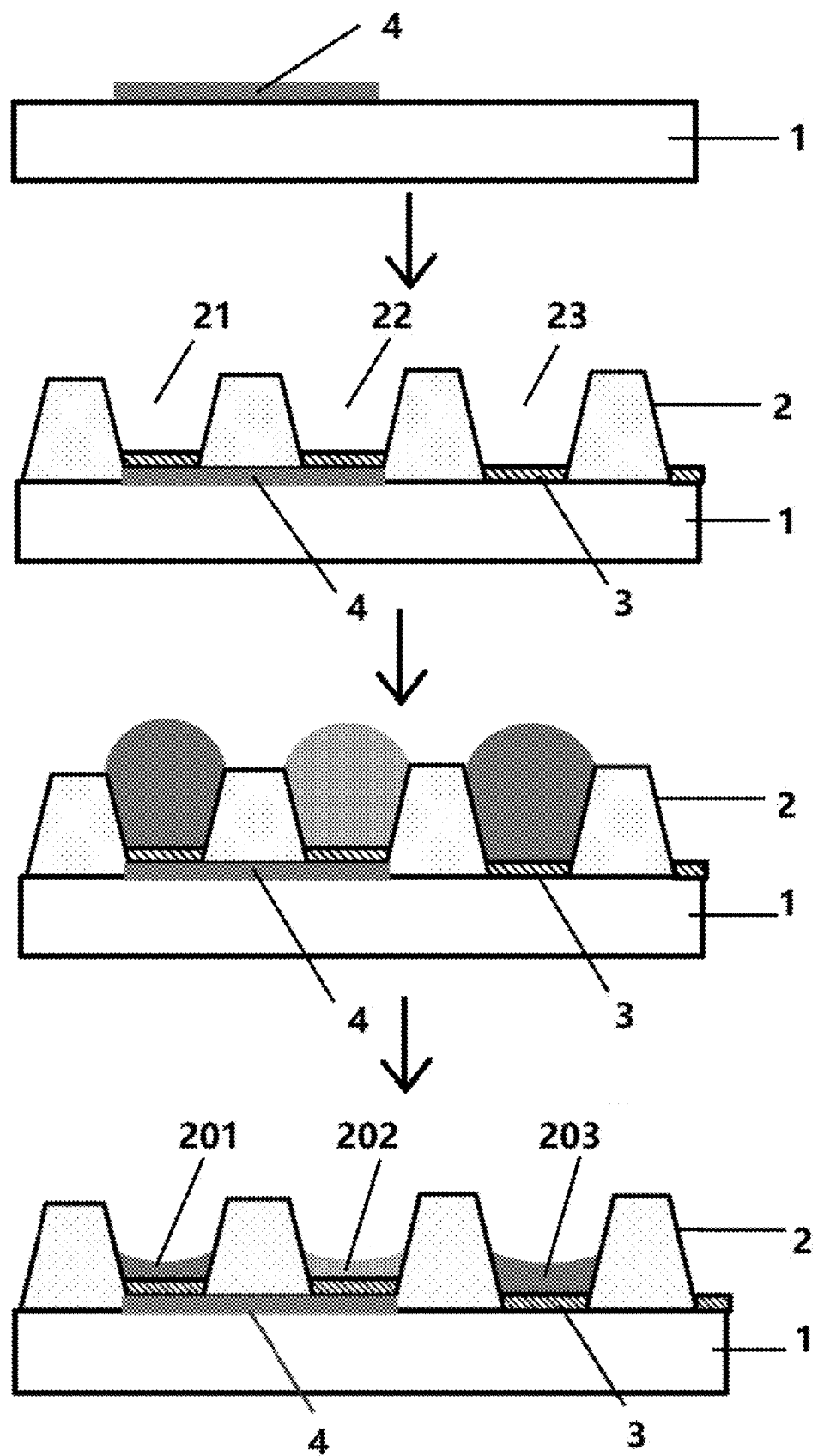
FIG. 6 is a schematic structural diagram of the organic light emitting device fabricated by the process of FIG. 5.

Referring to FIG. 4 in conjunction with FIG. 6, in another embodiment of the present invention, a method of fabricating an organic light emitting device is provided, including the following steps:

S1: providing the thin film transistor substrate 1;

S2: a thin film stand layer forming step, forming the thin film stand layer 4 on the thin film transistor substrate 1 by evaporation, sputtering, or coating, a material of the thin film stand layer comprising SiO2, and a thickness of the thin film stand layer 4 ranging from 0.1 um to 3 um, wherein a thin film stand is patterned to form the thin film stand layer 4 having a same area as red and green light emitting areas;

S3: a pixel defining layer forming step, fabricating the pixel defining layer 2 on the thin film transistor substrate 1, wherein the pixel defining layer 2 has a thickness ranging from 1 um to 5 um; and patterning the pixel defining layer 2 to form a red sub-pixel via hole 21, a green sub-pixel via hole 22, and a blue sub-pixel via holes 23;

S4: an inkjet printing step, filling the red sub-pixel via hole 21, the green sub-pixel via hole 22, and the blue sub-pixel via hole 23 with an inkjet printing ink, followed by drying to form a red sub-pixel 201, a green sub-pixel 202, and a blue sub-pixel 203.

Figure 5:
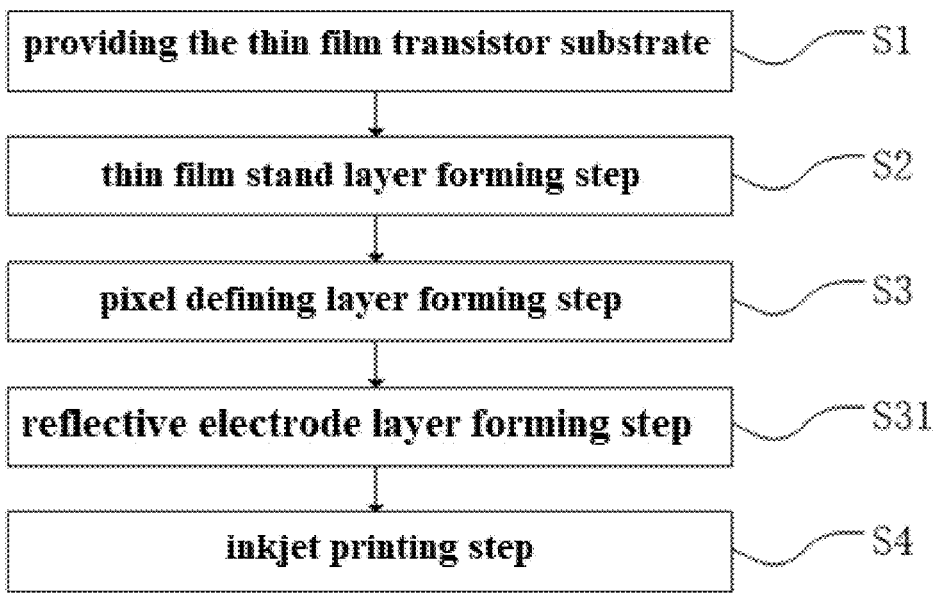
FIG. 5 is a flow chart of fabricating an organic light emitting device according to another embodiment of the present invention.

Referring to FIG. 5, in another embodiment of the present invention, the method of fabricating the organic light emitting device further includes a reflective electrode layer forming step S31 after the pixel defining layer forming step S3 and before the inkjet printing step S4, wherein in the reflective electrode layer forming step S31, a reflective electrode layer 3 is formed in the red sub-pixel via hole 21, the green sub-pixel via hole 22, and the blue sub-pixel via hole 23.

The invention has beneficial effects of providing an organic light emitting device and a method of fabricating the organic light emitting device thereof, wherein the thin film stand layer is disposed to raise the red sub-pixel via hole and the green sub-pixel via hole, such that the thickness of the layers satisfies the performance of the device to during inkjet printing while preventing an overflow problem caused by excessive printing ink, thereby improving a production yield of an organic light emitting device.

While the present invention has been described by way of example and in terms of the preferred embodiments, it is to be understood that the present invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. An organic light emitting device, comprising:
a thin film transistor substrate;
a pixel defining layer disposed on the thin film transistor substrate and comprising a plurality of via holes;
a plurality of sub-pixels disposed in the via holes correspondingly;
a thin film stand layer disposed on the thin film transistor substrate, wherein the thin film stand layer corresponding to a portion of the via holes causes a reduction in a depth of the portion of the via holes, and a depth of another portion of the via holes is greater than the depth of the portion of the via holes; and
a plurality of reflective electrode layers disposed between the thin film transistor substrate and the pixel defining layer, and disposed in the via holes in a one-to-one correspondence, wherein an upper surface of the thin film stand layer is in direct contact with two of the reflective electrode layers in adjacent two of the plurality of via holes, and the upper surface of the thin film stand layer is level and continuous across an entire gap between the two reflective electrode layers,
wherein the via holes comprise at least one red sub-pixel via hole, at least one green sub-pixel via hole, and at least one blue sub-pixel via hole; the sub-pixels comprise at least one red sub-pixel, at least one green sub-pixel, and at least one blue sub-pixel, which are respectively disposed in the red sub-pixel via hole, the green sub-pixel via hole, and the blue sub-pixel via hole; and the thin film stand layer is disposed on the thin film transistor substrate and corresponds to the red sub-pixel via hole and the green sub-pixel via hole, such that depths of the red sub-pixel via hole and the green sub-pixel via hole are less than a depth of the blue sub-pixel via hole.

2. The organic light emitting device according to claim 1, wherein the thin film stand layer has a thickness ranging from 0.1 µm to 3 µm.

3. The organic light emitting device according to claim 1, wherein a material of the thin film stand layer comprises $SiO_2$.

4. The organic light emitting device according to claim 1, wherein the pixel defining layer has a thickness ranging from 1 µm to 5 µm.

5. A method of fabricating the organic light emitting device according to claim 1, comprising the following steps:
a step of providing the thin film transistor substrate;
a thin film stand layer forming step of providing a thin film stand by evaporation, sputtering, or coating and patterning the thin film stand to form the thin film stand layer on the thin film transistor substrate, wherein a material of the thin film stand layer comprises $SiO_2$, a thickness of the thin film stand layer ranges from 0.1 µm to 3 µm, and the thin film stand layer has a same area as red and green light emitting areas;
a pixel defining layer forming step of fabricating the pixel defining layer on the thin film transistor substrate, wherein the pixel defining layer has a thickness ranging from 1 µm to 5 µm; and patterning the pixel defining layer to form a red sub-pixel via hole, a green sub-pixel via hole, and a blue sub-pixel via hole;
a reflective electrode layer forming step after the pixel defining layer forming step and before an inkjet printing step, wherein in the reflective electrode layer forming step, the plurality of reflective electrode layers are formed in the red sub-pixel via hole, the green sub-pixel via hole, and the blue sub-pixel via hole, wherein the upper surface of the thin film stand layer is in direct contact with two of the reflective electrode layers in adjacent two of the plurality of via holes, and the upper surface of the thin film stand layer is level and continuous across an entire gap between the two reflective electrode layers; and
the inkjet printing step of filling the red sub-pixel via hole, the green sub-pixel via hole, and the blue sub-pixel via hole with an inkjet printing ink, followed by drying to form a red sub-pixel, a green sub-pixel, and a blue sub-pixel.

* * * * *